United States Patent [19]

Ushiro

[11] 4,225,810
[45] Sep. 30, 1980

[54] WAVEFORM COMPARISON AND DISPLAY SYSTEM USING CATHODE RAY TUBE

[75] Inventor: Takanori Ushiro, Koganei, Japan

[73] Assignee: Iwasaki Tsushinki Kabushiki Kaisha, Tokyo, Japan

[21] Appl. No.: 936,933

[22] Filed: Aug. 25, 1978

[30] Foreign Application Priority Data

Aug. 31, 1977 [JP] Japan .............................. 52-103538

[51] Int. Cl.² ........................................... H01J 31/10
[52] U.S. Cl. ................................................. 315/392
[58] Field of Search ..................... 315/392; 343/5 EM

[56] References Cited

U.S. PATENT DOCUMENTS

| | | | |
|---|---|---|---|
| 2,962,625 | 11/1960 | Berwin et al. | 315/392 X |
| 3,543,269 | 11/1970 | Dudley | 343/5 EM |
| 3,599,034 | 8/1971 | Fischer, Jr. et al. | 315/392 |
| 3,721,856 | 3/1973 | Dick | 315/392 |
| 3,938,003 | 2/1976 | Shimizu | 315/392 |
| 4,069,481 | 1/1978 | Easy et al. | 343/5 EM X |

*Primary Examiner*—Malcolm F. Hubler
*Attorney, Agent, or Firm*—Robert E. Burns; Emmanuel J. Lobato; Bruce L. Adams

[57] ABSTRACT

A waveform comparison and display system using a cathode ray tube, which is provided with a digital memory function for sequentially storing input signal levels in digital quantities and re-reading them out under control of desired clock pulses and with a display function for displaying on the cathode ray tube two waveforms obtained in outputs produced by high-speed switching of the input signal and an analog signal re-read out. The storing operation and the sweep operation of the cathode ray tube are controlled by a trigger signal synchronized with the input signal. The generation of the clock pulses is start-stop controlled in synchronism with the sweep. Accordingly, the two waveforms are displayed on the screen of the cathode ray tube in such a manner that they are stationary with respect to each other.

5 Claims, 8 Drawing Figures

QUANTUM ERROR
RANGE ±1/2 LSB

QUANTUM ERROR
± LINIERITY ERROR

WAVEFORM COMPARISON AND DISPLAY SYSTEM USING CATHODE RAY TUBE

BACKGROUND OF THE INVENTION

1. Field Of The Invention

This invention relates to a system for simultaneously displaying the stored content of a waveform memory employing semiconductor storage elements and an instant waveform on the screen of a cathode ray tube of an oscilloscope.

2. Description Of The Prior Art

For storing and displaying an electrical signal waveform, there has heretofore been employed an oscilloscope using a bistable storage tube. This is commonly referred to as a memory scope. This device is very expensive and has a defect in the lifetime of the storage tube. Therefore, such a method has recently been employed in which an electrical signal waveform is stored in a semiconductor memory or the like after being converted to digital data and then read out to be converted again to an analog signal for an input to the Y axis of the cathode ray tube. This device has a feature of starting recording a waveform before occurrence of the phenomenon to be measured. With such a device, however, it is impossible to achieve stable observation of two waveforms with reference to their synchronized trigger points as mentioned below.

SUMMARY OF THE INVENTION

An object of this invention is to provide a waveform comparison and display system employing a cathode ray tube, in which a stable display relatively still waveforms can be performed under a low-speed sweep.

To attain the above object of this invention, the write and read functions of a waveform memory and the generation of clock pulses are controlled in synchronism with the sweep period of an oscilloscope.

BRIEF DESCRIPTION OF THE DRAWINGS

The principle, construction and operation of this invention will be clearly understood in comparison with prior arts from the following detailed description taken in conjunction with the accompanying drawings, in which.

ADDITIONAL DESCRIPTION OF PRIOR ARTS

Figure 1:
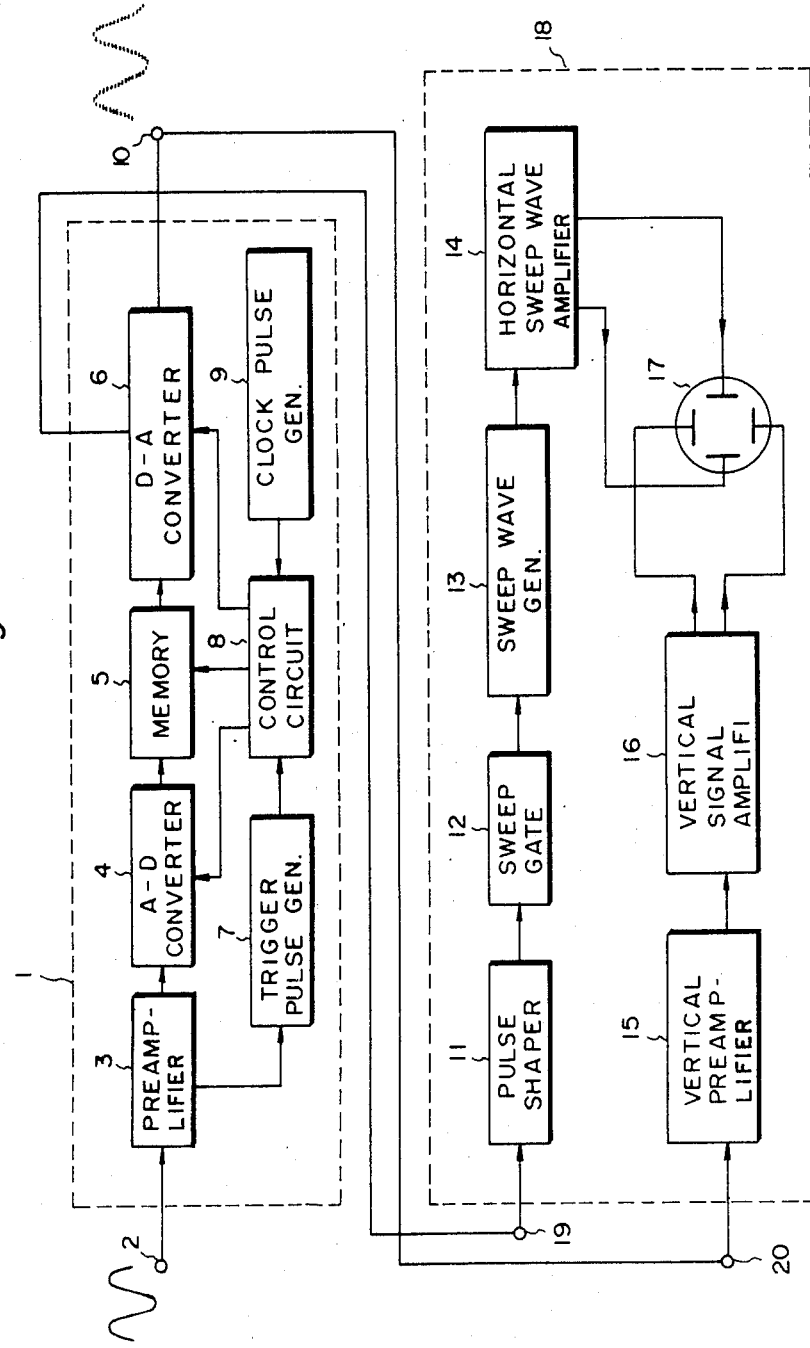
FIG. 1 is a block diagram illustrating a conventional display system using a combination of a waveform memory and an oscilloscope.

To make differences between prior arts and this invention clear, some examples of prior arts will first be described. In FIG. 1 showing an example of conventional devices, reference numerical 1 indicates a waveform memory; 2 designates the input terminal of the waveform memory 1; 3 identifies a preamplifier; 4 denotes an analog-to-digital converter (hereinafter referred to as the A-D converter; 5 represents a memory; 6 shows a digital-to-analog converter (hereinafter referred to as the D-A converter); 8 refers to a control circuit for controlling circuit stage 4, 5 and 6; 7 indicates a trigger pulse generator for driving the control circuit 8 in response to an input signal; 9 designates a clock pulse generator for generating clock pulses determining all operating speeds; and 18 identifies an oscilloscope. This is a block diagram in a case of the oscilloscope being operated on an external trigger input. Moreover, reference numeral 20 denotes a vertical axis input terminal; 15 represents a vertical axis preamplifier; 16 refers to a vertical signal amplifier for deflecting the vertical axis of a cathode ray tube 17; and 19 shows an external trigger signal input terminal, which provides a trigger signal to a trigger shaping circuit 11. A pulse shaped by the pulse shaper 11 opens a sweep gate 12 and, as a result of this, a sweep wave generator 13 produces a sweep wave to deflect the horizontal axis of the cathode ray tube 17 via a horizontal sweep wave amplifier 14.

The device of the above construction operates as follows: A signal applied to the terminal 1 is amplified by the preamplifier 3 to a level suitable for A-D conversion and then converted to a digital signal. One portion of this signal is shaped by the trigger pulse generator 7 into a trigger pulse, which drives the control circuit 8. By the action of the control circuit 8, sampling is achieved in response to the clock pulses from the clock pulse generator 9 at regular time intervals, and the sampled pulses are stored in the memory 5. When the instruction of the control circuit 8 has changed to a read instruction, the content of the memory 5 is applied to the D-A converter 6, and an analog signal is sent out in response to the clock pulses of the clock pulse generator 9 at a constant speed. This analog signal is applied to the vertical axis input terminal 20 of the oscilloscope 18 and a read gate signal is supplied to the external trigger signal input terminal 19. Under such conditions the vertical axis gain of the oscilloscope 18 is appropriately adjusted and the synchronizing level of the pulse shaper 11 and the sweep period of the sweep wave generator 13 are appropriately regulated, thus enabling the observation of a stored waveform.

Figure 2:
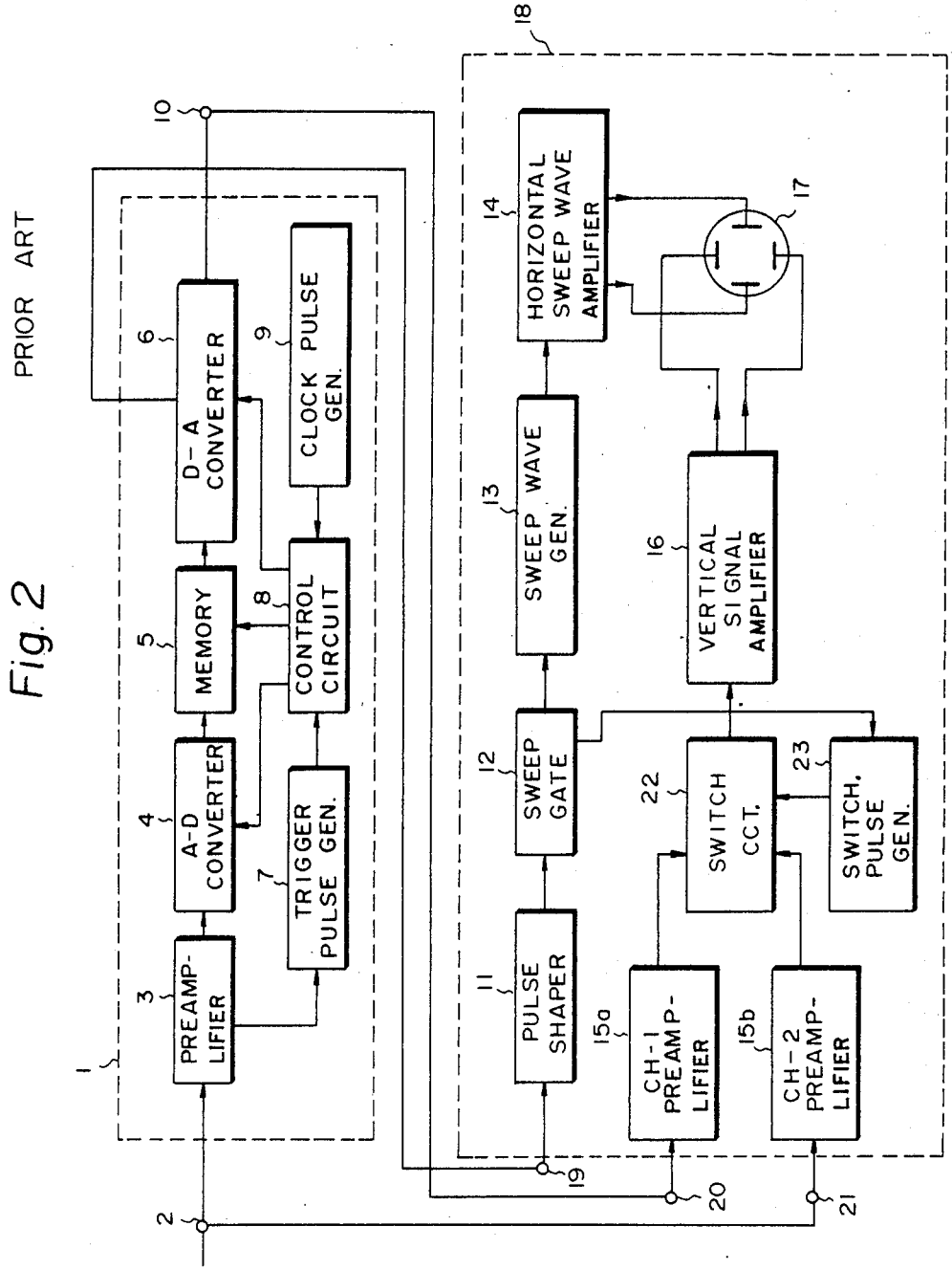
FIG. 2 is a block diagram illustrating a modified example of FIG. 1 to achieve a two-channel display.

There is no difficulty in merely observing the recorded waveform, but a problem arises in a case of comparing the recorded waveform with an instant waveform or another waveform having no time relationship to the recorded waveform. Let it be assumed that the system is constructed with a two channel oscilloscope having electronic switching for comparing an instant signal with a recorded waveform, for instance, as shown in FIG. 2. The electronic switching is achieved by the use of two preamplifiers 15a and 15b; that is, a switching circuit 22 is driven by the output from a switching pulse generator 23 to selectively connect the preamplifiers 15a and 15b to the vertical signal amplifier 16.

In this case, even if the channels are alternately swept by pulses generated in response to sweep gate pulses, or even if chopper switching is effected by the output from the switching pulse generator 23, it is impossible to observe the two waveforms stably synchronized in relation to each other because of a time lag and a phase shift between the compared waveforms which are caused by synchronization of the horizontal axis sweep of the oscilloscope with the read out waveform of the recorded waveform. Even if the two waveforms happen to have no time and phase differences therebetween, a change in the observing conditions readily introduces a fluctuation between them since the control circuit 8 and the clock pulse generator 9 of the waveform memory and the sweep signal generator 13 of the oscilloscope bear no relation to each other. Especially in a case of the oscilloscope, such observation of two waveforms as mentioned above is partly impossible because the oscilloscope itself has a blanking period, that is, a period during which no display can be provided, as is evident to those skilled in the art.

Figure 3:
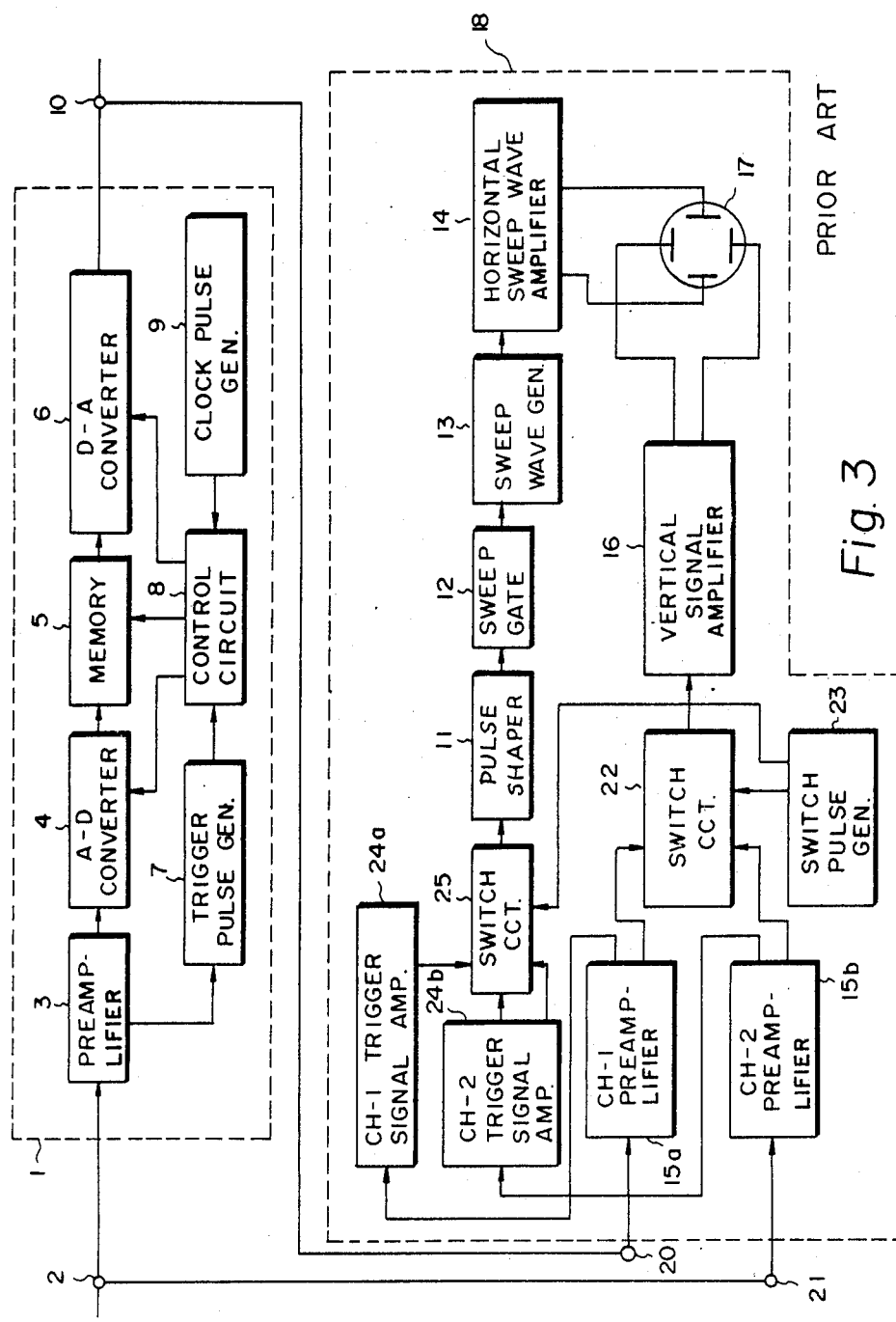
FIG. 3 is a block diagram illustrating an arrangement which is an improvement of the example shown in FIG. 2.
Figure 4A:
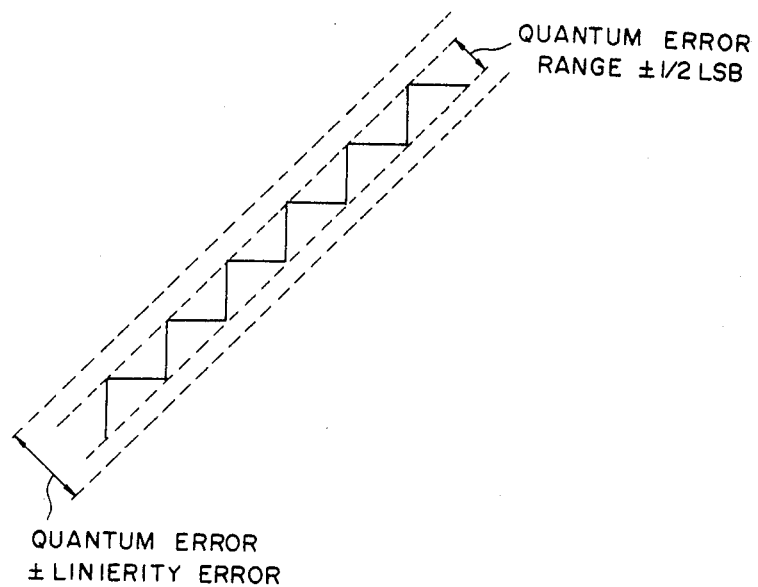
FIGS. 4A and 4B are waveform diagrams explanatory of the operation of the example of FIG. 3.
Figure 4B:
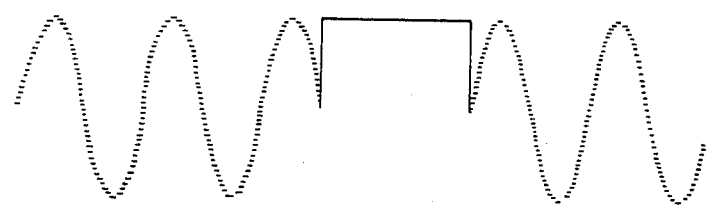

For the solution of the above problem, there has been proposed such circuit structure as shown in FIG. 3. This is the circuit in which a trigger signal amplifier for internal synchronization is divided into a circuit 24a for a channel CH-1 and a circuit 24b for a channel CH-2, which are selectively connected by a switching circuit 25 to the pulse shaper 11. This switching uses the output from the switching pulse generator 23 as is the case with the vertical axis preamplifiers 15a, 15b, and when the vertical axis preamplifier is of the channel CH-1, the trigger signal amplifier is also activated for the channel CH-1. In such a structure, however, the use of the aforementioned chopper switching is meaningless and the so-called alternate mode is employed in which the channels are switched for each sweep period. The method of switching the trigger signal source in such an alternate mode is called the alternate trigger method. In this instance, a signal applied to the channel CH-2 can be observed as a stable waveform in accordance with a constant trigger level determined by the pulse shaper 11. However, a signal applied to the channel CH-1 has a discontinuous staircase waveform, as shown in FIG. 4A and each of the subdivided steps varies in the range of ±2 LBS each time it is read out, so that a trigger level cannot be stably set. Therefore, the signal to be applied to the trigger signal amplifier 24a of the channel CH-1 must be a read gate signal of the waveform memory 1, and only the channel CH-1 is required to be given an external trigger input. With such a method, however, it is impossible to achieve stable observation of two waveforms with their trigger levels equalized with each other because of the relationships between the control circuit 8 and the clock pulse generator 9 in the waveform memory 1 and the sweep circuit of the oscilloscope and because of the blanking period of the oscilloscope, as previously referred to. Further, the output waveform of the waveform memory often has such a read interval as shown in FIG. 4B which is provided for convenience of its control, and this is also considered to hinder the stable observation.

For the comparison of the output waveform of the waveform memory with an instant waveform on the screen of the oscilloscope, there is no choice but to employ the alternate sweep since the two waveforms bear no time and phase relationships to each other. However, it is difficult to effect the comparison, operation under coincidence of leading portions of the compared signals and, in addition, such a waveform memory shows its effect in the low-speed sweep range and, in a slower sweep period, the waveforms appear one after another. Further, even in a relatively rapid sweep period, flickering is noticeable to make it impossible, in practice, to simultaneously observe the waveforms. In a case of an ordinary oscilloscope, there is a combination of a chopper mode and a normal trigger mode for such a purpose. This is a method in which two waveforms are switched by a high-speed switch to partly display them alternately with each other. With this method, however, the two waveforms cannot be stably synchronized with each other unless they bear time and phase relationships to each other, and consequently their synchronizing points can not be matched in time. This is especially so in a case where the two waveforms are different from each other in the aforesaid conditions and in the data read timing. A problem arises when the portions of the signals applied to the two channels have changed. It is possible to add to the control circuit 8 the function of observing a waveform preceding the trigger point or a point far away therefrom, which is one feature of the waveform memory, but, in such a case, simultaneous waveform observation is especially difficult.

Figure 5:
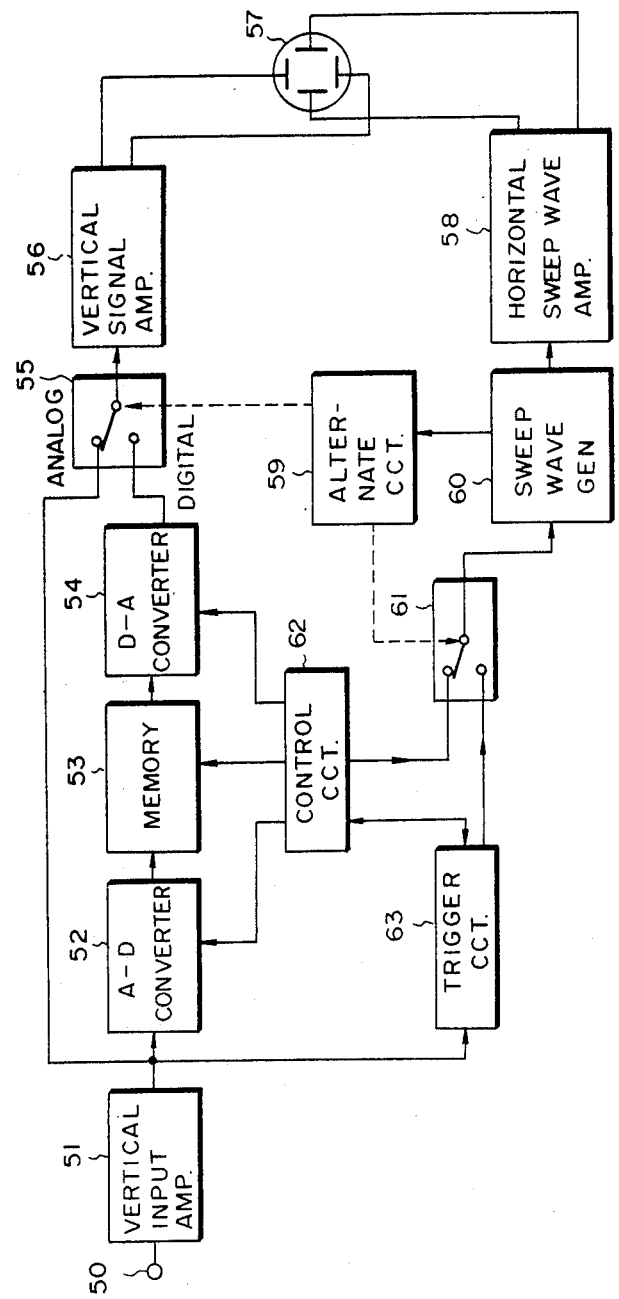
FIG. 5 is a block diagram illustrating another conventional circuit.

Described above are conventional examples in which the waveform memory unit and the oscilloscope unit are constructed independently of each other, as illustrated in FIGS. 1, 2 and 3. Additionally, there also exists such circuit construction as shown in FIG. 5 in which the two units are formed as a unitary structure in the same case. Reference numeral 50 indicates a vertical axis input terminal, which is connected to a vertical input amplifier 51. A reference numeral 52 designates an A-D converter, which receives a signal from the vertical input amplifier 51 to convert it to digital data, and the digital data are stored in a memory 53. The data stored in the memory 53 are converted again by a D-A converter to analog data. These operations are achieved under the instruction from a control circuit 62 which is driven by a trigger circuit 63 which performs pulse shaping of the vertical axis input signal. Reference numerals 55 and 61 identify switching circuits which select analog and digital display functions and which are driven by a gate signal from a sweep wave generator 60. A sweep sawtooth wave produced by the sweep wave generator 60 is amplified by a horizontal sweep amplifier 58 and then deflects the horizontal axis of a cathode ray tube 57. On the other hand, vertical axis deflection is carried out by the output from the switching circuit 55 which is amplified by a vertical signal amplifier 56. The abovesaid circuits are adapted such that the switching circuits 55 and 61 are changed over at each sweep to perform an ordinary oscilloscope function and a display function of a stored waveform alternately with each other. The aforementioned problem still remains unsolved and, after all, the above circuit construction is identical with the construction in which one of the two trigger input circuits in FIG. 3 is used as an external trigger circuit.

DESCRIPTION OF THE PREFERRED EMBODIMENTS

Figure 6:
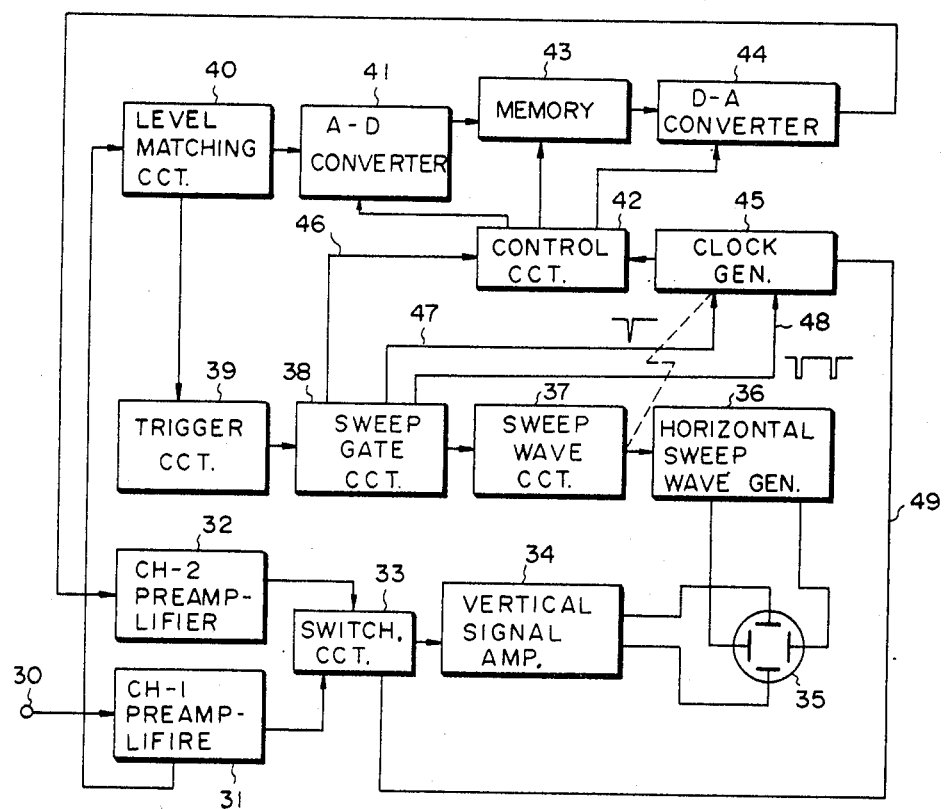
FIGS. 6 and 7 are block diagrams each illustrating an embodiment of this invention.

In FIG. 6 illustrating an embodiment of this invention, reference numeral 30 indicates a signal input terminal and 31 designates a preamplifier for the channel CH-1 which is adapted to amplify the signal input to provide a signal suitable for operation at the level of an electronic switching circuit 33, one portion of the amplified signal being applied as a signal for A-D conversion to a level matching circuit 40. Reference numeral 32 identifies a preamplifier for the channel CH-2, which receives the output from a D-A converter 44, described later on, and is selectively connected via the switching circuit 33 to a vertical signal amplifier 34 for the vertical axis deflection of a cathode ray tube 35. On the other hand, one portion of the signal applied to the level matching circuit 40 is applied to a trigger circuit 30 to drive a sweep gate circuit 38. Upon opening of the sweep gate circuit 38, a sawtooth wave is generated from a sweep wave generator 37. The sawtooth wave is amplified by a horizontal sweep wave amplifier 36 to deflect the horizontal axis of the cathode ray tube 35. The signal from the level matching circuit 40 is fed to an A-D converter 41 and is sampled at regular intervals under control of a digitalized control circuit 42 and stored in a memory 43. The digital data thus stored in the memory 43 are reconverted by a D-A converter 44 to an analog data under control of the same control circuit 42 and then applied to the preamplifier 32 for the channel CH-2.

The digital circuit in this embodiment is activated with clock pulses derived from a clock generator 45. The clock generator 45 is constructed to have a time relation with the sweep wave generator 37. For example, the digital circuit is designed so that while a sweep wave sweeps an effective sweep range of 10 cm of the cathode ray tube 35, the digital clock pulses step by 1000 words to provide waveforms of 100 sampled points during the scale sweep of 1 cm. Further, the digital circuit is adapted to receive the clock pulses from the clock generator 45 and operate under the control of the control circuit 42. The starting of this circuit is controlled by the leading portion of the sweep gate waveform, for instance, a rise-up signal 46. The clock generator 45 is so formed as to stop its function as the sweep circuit of the oscilloscope while the sweep gate 12 is closed. The clock generator 45 is composed of a crystal oscillator and a plurality of stages of frequency dividing counters for frequency dividing the output waveform of the crystal oscillator. These frequency dividing counters are arranged to be reset by the trailing portion of the oscilloscope sweep gate waveform, for example, its fall portion, and to start upon starting of the sweep period. This means the method in which, for instance, when the counters are formed with a cascade connection of decimal counters, each counter is reset to "9" at the end of the sweep period and set to "0" at the instant when a pulse is applied at the start of the sweep period.

Since such a construction is employed, the time margin of an oscilloscope hold-off circuit does not hinder the waveform display. During a writing period, the hold-off time in the digital circuit serves as an inhibit period as if it is a trigger hold-off in the oscilloscope.

The function of the clock generator 45 is stopped during the hold-off period corresponding to the gate period and, in addition, there is a relation between the sweep period and the clock pulses, so that the digital operation is performed exactly in response to the sweep gate period, that is, the display period of an instant signal. Accordingly, there are no possibilities of causing jitter in the digital signal or losing synchronization in the parallel display of the instant signal and the output signal of the memory.

A chop switching signal 49 is derived from the course of frequency dividing of the clock pulses produced as described above to control the switching operation in the switching circuit 33. The chop pulses correspond in time to an analog signal which is obtained in a staircase form by a digital operation, and greatly alleviates flickering in the time-shared display of the real time signal and the digital signal. For observing two signals having no time relationship to each other while holding them in a stably synchronized relation, the prior art method requires the alternate trigger method, as mentioned previously. With the construction of this invention, however, both of the signals can be stably synchronized with each other by the chop method without the use of switching of the alternate system, permitting the observation of the two signals without causing their traces to appear alternately with each other or flickering even in the field of the low-speed sweep in which the digital waveform memory is originally effective.

Moreover, by matching the clock pulse of the digital portion and that of the chop display to each other, it is also possible to apply blanking to any "glitch" which occurs in the digital conversion. The prior art encounters a problem in facilitating the use of the waveform memory in combination with the oscilloscope by giving priority to the function of the oscilloscope over the function of the waveform memory, but this invention settles the problem in the manner described above. With the method of this invention, however, since the oscilloscope itself has the blanking period, there might be caused an apprehension about the dead time during the blanking period. That is, in a case of observing an unpredictable phenomenon, for instance, when a recorder or the like is employed, the purpose can be attained by continuously feeding a recording paper, but the oscilloscope with the cathode ray tube has the blanking period, as mentioned above, and this sometimes makes it difficult to provide a continuous display of the phenomenon. Such an apprehension can be removed in the following manner. Of the circuits controlling the memory circuit, a counter for controlling the storage address of the memory operates to achieve the write operation in the memory at the same time as an instruction of storage is issued. Moreover, for a predetermined period of time from the time of arrival of a rise-up signal of the sweep gate signal from the oscilloscope, recording is continued but the operation is stopped. In other words, during the trigger waiting period, the apparatus is put in the sweep waiting state and in the write state to store the entire waveform in the memory. If the trigger level is set such that an abnormal phenomenon is detected at the trigger level, the operation stops after writing a predetermined amount of data in the memory upon occurrence of the abnormal phenomenon. This ensures to continue the observation without break and enlarges the function of the oscilloscope. Besides, the running cost can be reduced as compared with that in the case of recording with the recorder.

Figure 7:
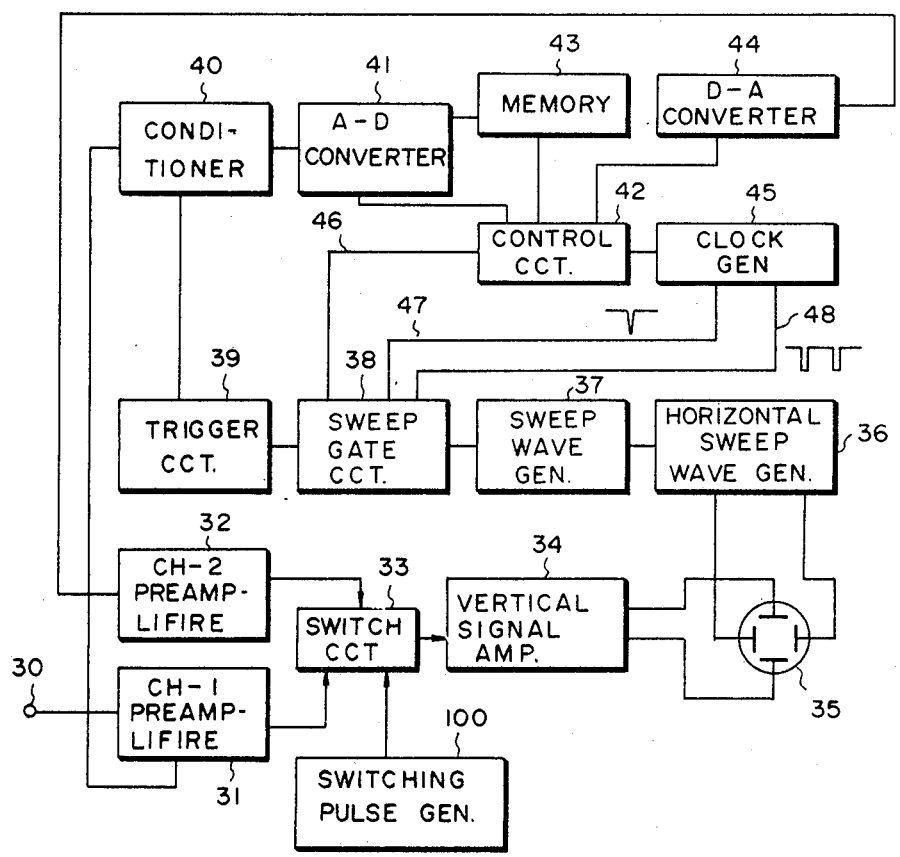

In FIG. 6, the switching circuit 33 is actuated with the pulses from the clock generator 45. With such an arrangement, it is possible to eliminate the influence of beats which might occur between the chop switching frequency and the input signal frequency or the repetition frequency of clock pulses and the reduction of the brightness can be prevented by making the chop blanking period and the digital display switching period correspond in time to each other and, in addition, the chop pulse generator can be omitted. Where such merits need not be expected, it is also possible to employ such circuit construction as shown in FIG. 7 in which a switching pulse generator 100 is added.

Some ordinary oscilloscopes already have a chop signal generator for switching two channels. In such a case where the input signal frequency or the repetition frequency of clock pulses and the chop switching frequency are greatly spaced apart from each other (in general, when the chop frequency is high), it is also possible to adopt the structure of FIG. 7, employing the chop signal generator.

The above description has been given in connection with an oscilloscope having a single sweep circuit but this invention is also applicable to an oscilloscope which has the so-called delayed sweep function, that is, an oscilloscope which has first and second sweep circuits and in which the second sweep circuit is driven at a desired timing relative to a first sweep period. In this instance, it is possible to obtain the function of delaying the start of the storing operation for a desired time relative to the trigger point.

As has been described in the foregoing, this invention provides the function which performs the waveform storage operation with a simple operation which is substantially the same as that of an ordinary oscilloscope. Since a stable display of a waveform can be obtained without flickering during the low-speed sweep, the system of this invention is suitable for use in such an oscilloscope for flow production which compares a stored waveform (a reference waveform) with an instant waveform.

What I claim is:

1. A waveform comparison and display system using a cathode ray tube comprising, input terminal means for receiving an input signal;

digital memory means connected to said input terminal means for sequentially storing levels of said input signal in digital quantities and for reading out the stored contents under control of clock pulses to provide an analog readout signal;

switch means connected to said input terminal means and said digital memory means for switching said input signal and said analog readout signal at a high speed;

display means connected to said switch means for displaying the switched two waveforms on the cathode ray tube;

control means connected to said digital memory means and said display means for controlling the storing operation of said digital memory means and the sweep operation of said display means by a trigger signal synchronized with said input signal and for start-stop controlling the generation of said clock pulses in synchronism with the sweep operation of said display means, so that the switched two waveforms are displayed on the screen of said cathode ray tube in such a manner that the two waveforms are stationary with respect to each other.

2. A waveform comparison and display system using a cathode ray tube according to claim 1, further including means for synchronizing said switching of said switch means with said clock pulses.

3. In an oscilloscope having a cathode ray tube for visually displaying a pattern, the combination comprising:

input means for receiving an input signal;

controlled digital memory means responsive to clock pulses for storing a sequence of digital values representative of an input signal applied to said input means and for reading out an analog signal having values equal to the sequence of stored digital values under control of the clock pulses;

vertical control means for controlling the vertical dimensions of the cathode ray tube pattern in response to signals applied to said vertical control means;

switching means connected to said input means and said controlled digital memory means for alternately applying the input signal and the signal read out from said digital memory means at a frequency substantially higher than a horizontal sweep frequency at which said cathode ray tube is operated to simultaneously display the waveform of the input signal and the waveform of the signal read out from the controlled digital memory means in a chopped mode;

triggered horizontal sweep control means for controlling the horizontal sweep of the cathode ray tube;

triggering means connected to said input means for triggering operation of said triggered horizontal sweep control means in response to said input signal; and clock pulse generating means responsive to operation of said triggered horizontal sweep control means for generating and applying the clock pulses to said controlled digital memory means only during a horizontal sweep period of said triggered horizontal sweep control means to display the waveform of the signal read out from said controlled digital memory means stationary with respect to the displayed input signal waveform.

4. In an oscilloscope according to claim 3, wherein said controlled digital memory means is comprised of:

an analog-to-digital converter connected to said input means for developing a sequence of digital valued signals representative of the values of the input signal;

a digital memory for storing and for reading out the sequence of digital valued signals developed by said analog-to-digital converter;

a digital-to-analog converter connected to said digital memory and said switching means for converting the sequence of digital valued signals read out from said digital memory into an analog signal having values equal to the sequence of digital valued signals and for applying the analog signal to said switching means; and control means responsive to the operation of said triggered horizontal sweep control means and responsive to the clock pulses for applying the output from said analog-to-digital converter to said digital memory to store said digital values in said digital memory and for applying the clock pulses to said digital memory to read out the stored digital values during and in synchronism with the operation of said triggered horizontal sweep control means.

5. In an oscilloscope according to claim 3, wherein said switching means is responsive to an external signal for switching in response to the external signal; and further comprising means for applying the clock pulses to said switching means to operate said switching means in response to the clock pulses.

* * * * *